United States Patent
Trinschek et al.

(10) Patent No.: US 9,989,234 B2
(45) Date of Patent: Jun. 5, 2018

(54) INTERIOR AIRCRAFT LED LIGHT UNIT

(71) Applicant: Goodrich Lighting Systems GmbH, Lippstadt (DE)

(72) Inventors: Robert Trinschek, Hamm (DE); Elmar Schrewe, Anroechte-Uelde (DE); Tomasz Kordecki, Hamm (DE)

(73) Assignee: GOODRICH LIGHTING SYSTEMS GMBH, Lippstadt (DE)

( * ) Notice: Subject to any disclaimer, the term of this patent is extended or adjusted under 35 U.S.C. 154(b) by 0 days. days.

(21) Appl. No.: 15/080,723

(22) Filed: Mar. 25, 2016

(65) Prior Publication Data

US 2016/0281971 A1    Sep. 29, 2016

(30) Foreign Application Priority Data

Mar. 27, 2015   (EP) .................................. 15161380

(51) Int. Cl.
*F21V 29/00* (2015.01)
*F21V 29/10* (2015.01)
(Continued)

(52) U.S. Cl.
CPC .............. *F21V 29/10* (2015.01); *B64D 11/00* (2013.01); *F21V 29/70* (2015.01); *F21V 29/89* (2015.01); *H05K 1/0209* (2013.01); *B64D 2011/0038* (2013.01); *B64D 2203/00* (2013.01); *F21V 23/005* (2013.01); *F21V 23/02* (2013.01); *F21W 2101/06* (2013.01); *F21Y 2101/02* (2013.01); *F21Y 2103/10* (2016.08);
(Continued)

(58) Field of Classification Search
CPC .......... F21V 29/10; F21V 29/70; F21V 29/89; F21V 23/005; B64D 2203/00; F21Y 2115/10; H05K 1/0206; H05K 1/021; H05K 1/0209; H05K 2201/09781; H05K 2201/10106; F21W 2101/06
USPC .......................................... 362/471, 488, 294
See application file for complete search history.

(56) References Cited

U.S. PATENT DOCUMENTS

2008/0137308 A1* 6/2008 MacDonald .............. F21K 9/00
                                                          361/720
2009/0296394 A1* 12/2009 Wang ........................ F21K 9/00
                                                          362/249.02
(Continued)

FOREIGN PATENT DOCUMENTS

EP            2163809 A2     3/2010
WO         2011106695 A1     9/2011

OTHER PUBLICATIONS

Extended European Search Report; Application No. 15161380.9-1757; dated Oct. 1, 2015; 5 pages.

*Primary Examiner* — Paultep Savusdiphol
(74) *Attorney, Agent, or Firm* — Cantor Colburn LLP

(57) ABSTRACT

An interior aircraft LED light unit includes at least one printed circuit board, on which a plurality of LEDs are connected to a power source, each one of the plurality of LEDs having a predetermined distance to the power source, and each one of the plurality of LEDs being associated with a respective thermal transfer member having a predetermined size, for transferring heat away from the respective LED, wherein, for at least some of the plurality of LEDs the predetermined size of the respective thermal transfer member varies with the predetermined distance of the LED to the power source.

18 Claims, 2 Drawing Sheets

(51) Int. Cl.
*H05K 1/02* (2006.01)
*F21V 29/70* (2015.01)
*F21V 29/89* (2015.01)
*B64D 11/00* (2006.01)
*F21V 23/00* (2015.01)
*F21V 23/02* (2006.01)
*F21W 101/06* (2006.01)
*F21Y 103/10* (2016.01)
*F21Y 115/10* (2016.01)
*F21Y 101/02* (2006.01)

(52) U.S. Cl.
CPC . *F21Y 2115/10* (2016.08); *H05K 2201/09781* (2013.01); *H05K 2201/10106* (2013.01)

(56) References Cited

U.S. PATENT DOCUMENTS

2013/0286644 A1* 10/2013 Lai .................. H05K 1/167
                                                 362/217.14
2014/0125213 A1* 5/2014 Kong .................. F21V 29/70
                                                 313/46

* cited by examiner

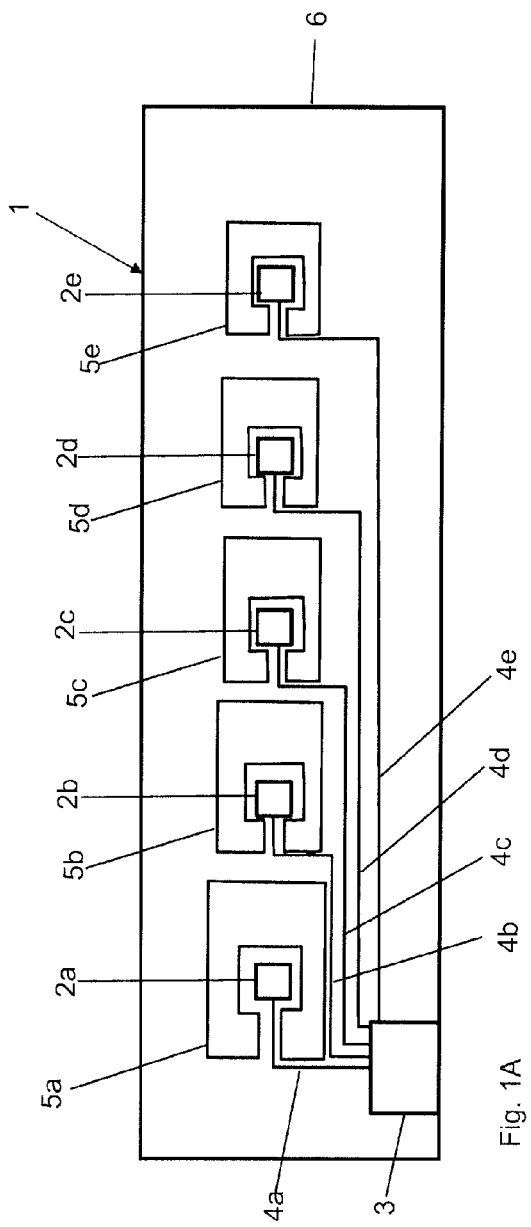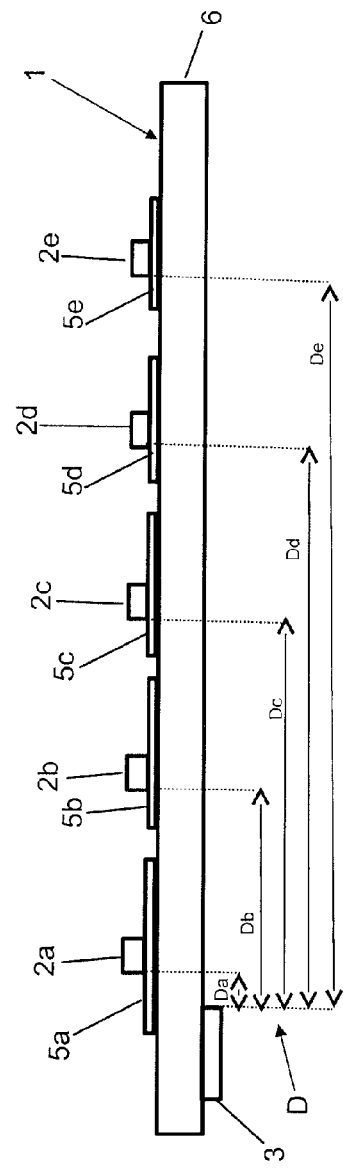

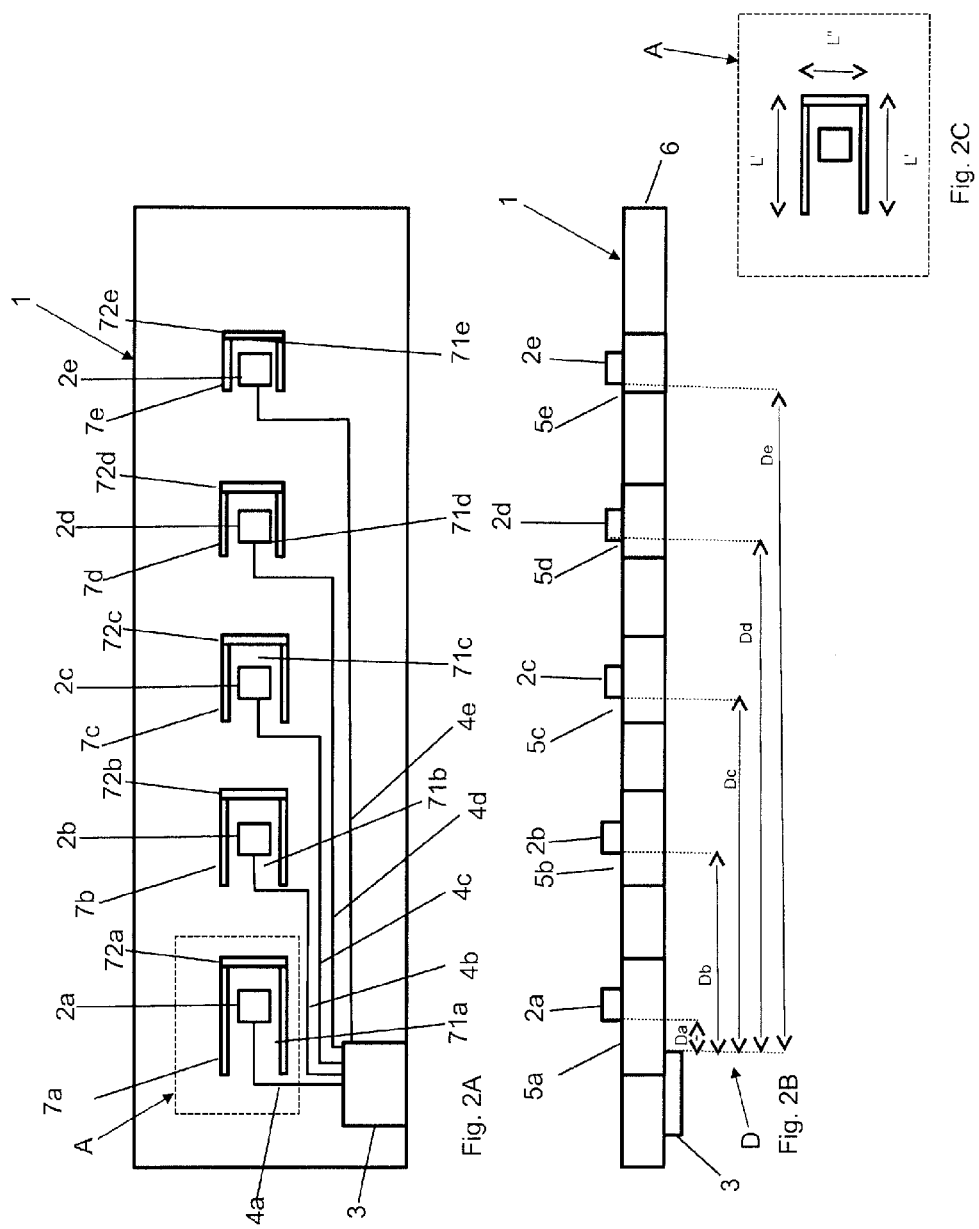

INTERIOR AIRCRAFT LED LIGHT UNIT

FOREIGN PRIORITY

This application claims priority to European Patent Application No. 15 161 380.9 filed Mar. 27, 2015, the entire contents of which is incorporated herein by reference.

TECHNICAL FIELD

The present invention relates to aircraft lighting systems, in particular, to interior aircraft LED light units provided inside an aircraft.

BACKGROUND OF THE INVENTION

In recent years, aircraft cabin lighting systems for providing ambient light employ more and more LED light units, replacing the formerly used neon lights (36 W or 48 W). LED based lighting systems in aircrafts are known which comprise one or more LEDs which are mounted on one or more printed circuit boards (PCB) together with a power supply and control circuit(s) and which are all interconnected by conductive paths of the printed circuit board. LED technology offers a number of advantages. For example, besides being highly cost-effective and having a long lifetime, which is about 10 to 20 times higher than the lifetime of neon lights, LED lighting systems may also be controlled so as to provide different colors and brightness. However, such LED based lighting systems exhibit deterioration in brightness and/or color over time that mandates replacement of the light units, leading to non-satisfactory lifetimes in various applications.

Accordingly, it would be beneficial to provide an interior aircraft LED light unit that exhibits slower deterioration, leading to an even higher lifetime thereof.

SUMMARY

Exemplary embodiments of the invention include an interior aircraft LED light unit comprising at least one printed circuit board (PCB) on which a plurality of LEDs is connected to a power source, each one of the plurality of LEDs having a predetermined distance to the power source, and each one of the plurality of LEDs being associated with a respective thermal transfer member having a predetermined size, for transferring heat away from the respective LED, wherein, for at least some of the plurality of LEDs, the predetermined size of the respective thermal transfer member varies with the predetermined distance of the LED from the power source. By placing the LEDs in heat exchange relationship with respective thermal transfer members with varying size, whereby the size of the thermal transfer member depends on the distance of the respective LED from the power supply, the altering process of the respective LEDs on the PCB can be influenced individually. In this way, different aging behaviors of the LEDs and different momentary light output levels due to different operating temperatures can be compensated for. Equal or similar aging and light output behaviors can be achieved among the plurality of LEDs, which provides for an even or similar light output among the plurality of LEDs over time, which in turn extends the duration of an acceptable light output of the interior aircraft LED light unit. Areas of differing light outputs across the light emission surface of the interior aircraft LED light unit, which are perceived as disturbing by the persons inside the aircraft, can be prevented in this manner.

The power source may be a power supply circuit, receiving power from an outside power network and conditioning the power for supply to the plurality of LEDs. The terms power source and power supply are used interchangeably herein.

The term at least one printed circuit board is used, because the interior aircraft LED light unit may have one printed circuit board that carries all of the plurality of LEDs or may have a plurality of printed circuit boards that are interconnected, such as mechanically coupled via matching contours and/or mechanical connectors and electrically coupled via suitable electric connections, with the plurality of LEDs being distributed among the plurality of printed circuit boards. For ease of description, it is mostly referred to a single printed circuit board herein. However, it is understood that a plurality of printed circuit boards may be present.

In particular, the differing deteriorating effect of the power supply on the different LEDs can be decreased or even be fully evened out by thermal transfer members of different sizes. In prior art approaches, the LEDs which are mounted on the PCB close to the power supply, due to the heat radiation of the latter, are exposed to higher temperatures than LEDs placed farther away from the power supply. The differing temperature levels of the LEDs located close to the power supply and the LEDs located farther away or distant from the power supply, with the differing temperature levels differing by 10° C. to 20° C. in prior art approaches, have two effects. Firstly, the LEDs close to the power supply will have a lower momentary output level with respect to the LEDs distant from the power supply. Secondly, the LEDs close to the power supply will be subject to aging more than the LEDs located distant from the power supply. Different aging processes will, in turn, again result in different light output levels of the respective LEDs. In particular, LEDs subject to a stronger aging process will have a lower light output level after a certain time period than LEDs subject to a comparably lesser aging process. These two effects can be decreased by the thermal transfer members of different sizes, leading to a more uniform momentary light output by the LEDs and also leading to a more uniform aging of the LEDs. This leads to a more uniform light output, both at the beginning of the using of the interior aircraft LED light unit as well as over time, which leads to a longer duration of an acceptable light output, i.e. to a longer life time. Further, as the LEDs age in a similar manner, they can be jointly controlled to counter the aging process, leading to an even further extension of the life time.

In particular, a thermal transfer member of an LED which is distant from the power supply may be made smaller than a thermal transfer member of an LED which is close or adjacent to the power supply. Thereby, the LED distant from the power source is cooled less than an LED close to the power source which is exposed to heat radiated from the power supply. By this measure, the temperatures to which the respective LEDs on the PCB are exposed at different locations can be adapted to each other and a uniform altering process can be achieved. Also, when the light is switched on, a uniform light output level for all LEDs on the PCB will be obtained by such a configuration. It is made possible that uniform light output levels are achieved and maintained for all LEDs mounted on a PCB, irrespective of their distance from the power supply.

The predetermined sizes of the respective thermal transfer members do not have to be different for all LEDs of the interior aircraft LED light unit. As stated above, the variation with distance applies to at least some of the plurality of LEDs. In other words, there is a subset of the plurality of LEDs for which the predetermined size of the respective thermal transfer member varies with the predetermined distance of the LED to the power source. The subset comprises two or more or all of the plurality of LEDs. In particular, the subset may comprise at least 5 of the plurality of LEDs, in particular at least 10 of the plurality of LEDs, further in particular at least 15 of the plurality of LEDs. The subset may comprise those at least 5, 10 or 15 LEDs that are closest to the power source. The farther a particular LED is removed from the power source, the lower is the thermal influence of the power source. Accordingly, certain ones of the plurality of LEDs may be so far removed from the power source that their respective thermal transfer members may be of similar or equal sizes. For said at least some of the plurality of LEDs, the predetermined size of the respective thermal transfer member may be a monotonically decreasing function of the predetermined distance of the LED to the power source.

According to a further embodiment of the invention, the plurality of LEDs comprises a first LED, being associated with a first thermal transfer member, and a second LED, being associated with a second thermal transfer member, wherein the first LED is located closer to the power source than the second LED, and wherein the predetermined size of the first thermal transfer member is larger than the predetermined size of the second thermal transfer member. The larger the thermal transfer member, the stronger the cooling effect will be and the smaller the thermal transfer member, the less the cooling effect will be. Thus, the LEDs which are exposed to thermal radiation from the power supply are associated with larger thermal transfer members and LEDs which are not exposed to as much additional heat are associated with smaller thermal transfer members so that the temperature, to which all LEDs on the PCB of the interior aircraft LED light unit are exposed, is leveled out across the surface of the PCB on which the LEDs are placed at different predetermined distances from the power supply. The condition of the thermal transfer member of the closer LED being larger than the thermal transfer member of the more distant LED, with respect to the power supply, may be fulfilled for at least 80% of all pairs of LEDs, in particular for at least 90% of all pairs of LEDs, further in particular for all pairs of LEDs.

According to a further embodiment, a temperature gradient $\Delta T$ of less than 10° C. in operation is present across the entire PCB(s). I. e., the LED(s) which is/are located directly adjacent to the power supply on the PCB will not be subjected to temperatures which differ more than 10° C. from the temperatures to which the LED(s) which is/are located farthest away from the power supply. In a particular embodiment, said temperature gradient $\Delta T$ in operation is less than 5° C.

According to a further embodiment of the invention, the thermal transfer member is a thermal pad. Preferably, the thermal pad is made from copper, which has a very good thermal conductivity. According to a particular embodiment, each of the thermal transfer members is a thermal pad.

According to a further embodiment, each of the thermal transfer members has a thermal transfer surface, in particular a substantially rectangular plate-shaped thermal transfer surface, wherein a surface area of the thermal transfer member that is associated with the LED having the lowest predetermined distance to the power source lies within the range of 0.5 mm$^2$ and 40 mm$^2$ and wherein a surface area of the thermal transfer member that is associated with the LED having the largest predetermined distance to the power source (3) lies within the range of 0.2 mm$^2$ and 25 mm$^2$. By these specific dimensions of the respective thermal transfer members which can be determined either by computer simulation or experimentally in an iterative process, an adaptation of the altering process of the LEDs on the PCB which are distant from the power source to the altering process of the LEDs on the PCB close to the power source can be realized and fairly uniform light output levels of all LEDs can be achieved. In particular, momentary light output differences, which were in the order of 30% in prior art approaches, can be decreased significantly.

According to a further embodiment, a ratio of the size of the thermal transfer member that is associated with the LED having the lowest predetermined distance to the power source to the size of the thermal transfer member that is associated with the LED having the largest predetermined distance to the power source lies within the range of 1.2 to 3, in particular within the range of 1.5 and 2. With this ratio, a particularly beneficial adaptation of the altering process and the light output levels of the plurality of LEDs mounted on the PCB may be achieved.

According to a further embodiment, the difference between the size of the thermal transfer member that is associated with the LED having the lowest predetermined distance to the power source and the size of the thermal transfer member that is associated with the LED having the largest predetermined distance to the power source lies within the range of 0.3 mm$^2$ and 20 mm$^2$.

According to another embodiment, each of the thermal transfer members comprises a respective section of the at least one printed circuit board and at least one aperture in the at least one printed circuit board, in particular at least one slot in the at least one printed circuit board, the at least one aperture defining the respective section of the at least one printed circuit board and at least partially limiting a thermal transfer out of the respective section of the at least one printed circuit board. The heat transfer away from the LED does not necessarily take place via thermal pads. It is also possible that the PCB itself distributes the heat across the PCB, thus cooling the individual LEDs. While this type of cooling is less efficient than the cooling via thermal pads, it may be sufficient for particular application and is more easily implemented. The cooling via the PCB can be influenced via apertures in the PCB. The more apertures are provided in the vicinity of a particular LED, the lower is the ability of the PCB to transfer heat away. The apertures are barriers for the heat transfer through the PCB. Accordingly, by providing one or more apertures around an LED and by thus limiting the thermal transfer out of this section of the PCB, i.e. by creating a heat pocket around a particular LED, the operating temperature of this particular LED can be influenced. The at least one aperture may be a non-linear aperture or a set of apertures that are arranged in such a way that they define a respective section of the PCB around the LED in question. The respective section of the PCB is defined by the at least one aperture, e.g. via completing an enclosed polygonal structure around the LED on the basis of the at least one aperture by one or more imaginary lines.

According to a further embodiment, the at least one aperture may comprise at least one slot and/or at least one via.

According to a further embodiment, a size of the respective section of the at least one printed circuit board of the thermal transfer member that is associated with the LED having the lowest predetermined distance to the power source lies within the range of 0.5 mm² and 40 mm² and wherein a size of the respective section of the at least one printed circuit board of the thermal transfer member that is associated with the LED having the largest predetermined distance to the power source lies within the range of 0.2 mm² and 25 mm².

According to a further embodiment, a ratio of the size of the respective section of the at least one printed circuit board of the thermal transfer member that is associated with the LED having the lowest predetermined distance to the power source to the size of the respective section of the at least one printed circuit board of the thermal transfer member that is associated with the LED having the largest predetermined distance to the power source lies within the range of 1.2 to 3, in particular within the range of 1.5 to 2.

According to a further embodiment, the thickness of the thermal transfer member lies within the range of 15 μm to 30 μm. In particular, the thickness of the thermal transfer member may be 30 μm for achieving a highly efficient cooling effect.

The printed circuit board may comprise a base material made from fiber glass. In a particular embodiment, the base material may have a thickness within the range of 0.5 mm to 2 mm. In particular, the thickness of the base material of the PCB may be about 1 mm.

According to a further embodiment, an operating temperature of each of the plurality of LEDs is between 70% and 130%, in particular between 80% and 120%, of an average operating temperature of the plurality of LEDs. In this way, very similar operating temperatures and thus very similar operating and aging characteristics are achieved. The given range of operating temperatures is for the case of each of the plurality of LEDs being fed with the same nominal supply current.

According to a further embodiment, the interior aircraft LED light unit comprises a control circuit that is configured to jointly control the brightness and/or color of all of the plurality of LEDs. In this way, the brightness and/or color of all of the plurality of LEDs is jointly adjustable. In this way, a degeneration of the LEDs can be counteracted. Because all LEDs degenerate in a similar manner due to the thermal transfer members that vary in size, only one control circuit and one control logic is sufficient for further extending the lifetime of high quality light output even further.

Exemplary embodiments of the invention further include an aircraft, in particular, an air plane or a helicopter comprising at least one interior aircraft LED light unit, as described in any of the embodiments above, disposed inside the aircraft. The features, modifications and advantages, described above with respect to the interior aircraft LED light unit, equally apply to the aircraft.

Exemplary embodiment of the invention further include a method of designing an interior aircraft LED light unit, comprising the steps of providing at least one printed circuit board, on which a plurality of LEDs are connected to a power source, each one of the plurality of LEDs having a predetermined distance to the power source, determining a preliminary operating temperature of each one of the plurality of LEDs, when supplied with a predefined supply current from the power source, and providing, for each one of the plurality of LEDs a respective thermal transfer member having a predetermined size for transferring heat away from the respective LED, wherein the predetermined size of the respective thermal transfer member is selected dependent on the preliminary operating temperature of the respective LED, such that actual operating temperatures of the plurality of LEDs are leveled as compared to the preliminary operating temperatures. In other words, the actual operating temperatures of the LEDs, i.e. the operating temperatures in the presence of the thermal transfer members, are more uniform than the preliminary operating temperatures, i.e. the operating temperatures in the absence of the thermal transfer members. The degree of uniformity may be determined with various measures, such as the standard deviation of the operating temperatures or the largest deviation from an average operating temperature value.

According to a further embodiment, the step of determining the preliminary operating temperature may comprise either a step of measuring the preliminary operating temperature, with the at least one printed circuit board, the plurality of LEDs and the power source being provided in a hardware implementation, or a step of determining the preliminary operating temperature by simulation, with the at least one printed circuit board, the plurality of LEDs and the power source being provided in as a software model.

According to a further embodiment, the steps of determining the preliminary operating temperature and providing the respective thermal transfer member with the predetermined size may be carried out iteratively. Each of these iterations may provide for a fine-tuning of the leveling of the actual operating temperatures of the plurality of LEDs.

The features, modifications and advantages, discussed above with respect to the interior aircraft LED light unit, apply to the method of designing the interior aircraft LED light unit in an analogous manner, and analogous method steps are disclosed herewith.

BRIEF DESCRIPTION OF DRAWINGS

Embodiments of the invention are described in further detail below with reference to the figures, wherein:

FIGS. 1A and 1B show respective schematic views of a printed circuit board with five LEDs as used in an exemplary embodiment of an interior aircraft light unit according to the invention; and FIG. 2A, 2B, 2C show respective schematic views of another printed circuit board with five LEDs as used in a further exemplary embodiment of an aircraft interior light unit according to the invention.

DETAILED DESCRIPTION OF THE INVENTION

FIG. 1A shows a schematic plan view onto a printed circuit board (PCB) 1 as used in an exemplary embodiment of an interior aircraft light unit according to the invention. FIG. 1B is a side view of the PCB 1 shown in FIG. 1A. It should be noted that on the PCB 1, only components which are relevant for the invention are illustrated schematically. However, further components may also be provided on the PCB 1, as e.g., control circuitry, etc.

As can be seen in FIG. 1A and FIG. 1B, there is a plurality of LEDs, consisting of five LEDs 2a, 2b, 2c, 2d, 2e, mounted on the PCB 1 which are basically arranged on a center line of the PCB 1 with substantially equal distances from each other. In FIGS. 1A and 1B on the lower left hand side of the PCB 1, a power supply 3 is arranged. The LED indicated by reference numeral 2a, which is located in FIGS. 1A and 1B also on the left hand side of the PCB 1 in the configuration shown, is directly adjacent to the power source 3, whereas the other LEDs 2b, 2c, 2d, and 2e from the plurality of LEDs have a larger predetermined distance D to the power source 3 than the LED 2a. Here, the LED indicated by reference numeral 2e is the one placed farthest away from the power source 3, thus having the largest predetermined distance De to the power source 3. Each LED 2a, 2b, 2c, 2d, 2e is connected to the power source 3 by respective conductor paths 4a, 4b, 4c, 4d, 4e.

In such arrangements of LED light units, usually the LED which closest to the power source 3 is subject to higher temperatures than the other LEDs. Specifically, the temperature, transferred from the power source 3 and experienced by the LEDs 2a, 2b, 2c, 2d, 2e on the PCB, decreases the farther away the LEDs 2a, 2b, 2c, 2d, 2e are located from the power source 3. The temperature difference $\Delta T$ from the LED 2a directly adjacent to the power source 3 to the LED 2e farthest away from the power source 3 would lie within the range of 10 to 20° C. in prior art approaches. Due to these different temperatures, to which the single LEDs 2a, 2b, 2c, 2d, 2e are exposed, the latter will be subject to different altering processes. In particular, the LED 2 closest to the power source 3 having the smallest predetermined distance Da and, thus, being exposed to the highest temperatures radiated from the power source 3 will be subject to stronger altering than the other LEDs 2b, 2c, 2d, 2e having larger predetermined distances Db, Dc, Dd, De to the power source 3 (FIG. 1B) in prior art approaches. LED 2e, which has the largest predetermined distance De to the power source 3 and thus is exposed to substantially lower temperatures, will experience the least altering. These differing altering processes of the single LEDs 2a, 2b, 2c, 2d, 2e, however, will on the one hand result in different aging behaviors of the individual LEDs 2a, 2b, 2c, 2d, 2e mounted on the PCB 1 and in differing light output levels in prior art approaches. Specifically, the light output level of the LED 2a directly adjacent to the power source 3 will be lower after a certain period of time than the light output levels of the other LEDs 2b, 2c, 2d, 2e. This leads to a non-uniform illumination result of the interior aircraft LED light unit, which will be perceived as disturbing and which will lead to a comparably early decommission of the interior aircraft LED light unit.

In order to avoid these drawbacks, according to the embodiment shown in FIGS. 1A and 1B, each one of the LEDs 2a, 2b, 2c, 2d, 2e is associated with a respective thermal transfer member 5a, 5b, 5c, 5d, 5e. I.e., LED 2a is associated with thermal transfer member 5a, LED 2b is associated with thermal transfer member 5b, etc. The thermal transfer members 5a, 5b, 5c, 5d, 5e here are thermal pads made from copper which provide for heat dissipation away from the respective LEDs 2a, 2b, 2c, 2d, 2e. In order to compensate for the thermal difference between the single LEDs 2a, 2b, 2c, 2d, 2e which all have different predetermined distances with respect to the power source 3, the thermal transfer members 5a, 5b, 5c, 5d, 5e have different sizes due to which they provide different cooling effects. Specifically, the largest thermal transfer member 5a, which has the greatest cooling effect, is located at or associated with the LED 2a which is directly adjacent to the power source 3 and thus, is exposed to the highest temperatures. The smallest thermal transfer member 5e which has the least cooling effect is located at or associated with the LED 2e having the largest predetermined distance De to the power source 3 on the PCB 1 and which, therefore, is least exposed to thermal radiation from the power source 3.

The sizes of the thermal pads 5b, 5c, 5d lying in between these outermost thermal pads 5a and 5e decrease continuously with increasing predetermined distance D of the respective associated LED 2b, 2c, 2d from the power source 3. In the depicted exemplary embodiment, the ratio of the size of the thermal pad 5a directly adjacent to the power source 3 having the smallest predetermined distance Da to the size of the thermal pad 5e having the largest predetermined distance De to the power source 3 preferably is about 1.5.

The thickness of the respective thermal pads 5a, 5b, 5c, 5d, 5e may be approximately 30 μm, and the thickness of the base material 6 of the PCB 1 may be approximately 1 mm. The base material 6 comprises fiber glass. The thermal pads 5a, 5b, 5c, 5d, 5e comprise copper due to its good thermal conductivity. However, also other materials and dimensions are conceivable.

With respect to the configuration described above, by compensating the heat radiation of the power source 3 by means of the thermal transfer members 5a, 5b, 5c, 5d, 5e having different sizes, the temperature difference $\Delta T$ mentioned above can be reduced to a temperature difference below 10° C., in particular, below 5° C. Also, when switching on the LEDs 2a, 2b, 2c, 2d, 2e, usually without the compensation means according to above described embodiments of the present invention, brightness differences of about 30% would occur which can be substantially eliminated by the configuration described above.

In case the power source 3 would be located at a different position on the PCB 1, then the sizes of the thermal transfer members 5a, 5b, 5c, 5d, 5e may be varied accordingly, i.e., depending on the predetermined distance D to the power source 3.

FIG. 2A and FIG. 2B show respective schematic views of another printed circuit board 1 with five LEDs 2a, 2b, 2c, 2d, 2e as used in a further exemplary embodiment of an interior aircraft LED light unit according to the invention. FIG. 2C is a detailed view of the portion of the PCB 1 indicated by reference numeral A in FIG. 2A. Here, the configuration of the PCB 1 basically is similar to the one already described with respect to FIG. 1A and FIG. 1B. However, the thermal transfer members here are embodied in a different manner.

The interior aircraft LED light unit of the embodiment of FIG. 2A and FIG. 2B has five thermal transfer members 7a, 7b, 7c, 7d, 7e. Each of the thermal transfer members is associated with a respective one of the LEDs 2a, 2b, 2c, 2d, 2e. Each of the thermal transfer members 7a, 7b, 7c, 7d, 7e comprises a respective section of the printed circuit board 71a, 71b, 71c, 71d, 71e and a respective set of slots 72a, 72b, 72c, 72d, 72e, extending through the printed circuit board 1. For each of the thermal transfer members, the set of slots forms a slot arrangement, having a U-form, around the respective LED. The respective section of the printed circuit board 1 is the part of the printed circuit board 1 located on the inside of the U-formed slot arrangement and the imaginary line closing the U at its open side. In particular, the slot arrangement 72a circumscribes the LED 2a on three sides. The section of the printed circuit board 1 that is around the LED 2a and within the slot arrangement 72a is the section of the printed circuit board 71a, belonging to the thermal transfer member 7a.

In the particular embodiment shown, each set of slots 72a, 72b, 72c, 72d, 72e comprises three slots, respectively, that jointly form the respective U-shape. Each set of slots 72a, 72b, 72c, 72d, 72e may also be replaced by only one slot having a substantially U-shape. Other shapes and configurations of aperture arrangements, such as arrangements of vias through the printed circuit board, are also conceivable.

The sets of slots 72a, 72b, 72c, 72d, 72e are barriers to the heat transfer away from the respective LEDs 2a, 2b, 2c, 2d, 2e through the material of the printed circuit board. The closer the set of slots is around the respective LED, the smaller is the heat conduction path out of the respective section of the printed circuit board. The sets of slots create heat pockets for the heat generated by the LEDs. The smaller the heat pocket, the more LED-generated heat remains in the vicinity of the LED and, thus, the higher the LED operating temperature. This effect may be used for balancing the heating effect of the power supply 3, which was discussed above. Less cooling is provided by smaller sections of the printed circuit board in the thermal transfer members for LEDs located at a larger predetermined distance from the power source 3, in order to compensate for heat radiation to which the LEDs located closer to the power source 3 are exposed and to thereby adjust the altering processes and light output of all LEDs 2a, 2b, 2c, 2d, 2e to a more uniform level.

Specifically, as can be seen in FIG. 2C for the example of the set of slots 72a surrounding LED 2a, the set of slots 72a comprises two slots of length L' and one slot of length L". The size of the thermal transfer member 71a is L' multiplied with L". In the depicted exemplary embodiment, the ratio between the size of the thermal transfer member closest to the power source 3 and the size of the thermal transfer member farthest away from the power source 3 may be about 1.5.

While the invention has been described with reference to exemplary embodiments, it will be understood by those skilled in the art that various changes may be made and equivalents may be substituted for elements thereof without departing from the scope of the invention. In addition many modifications may be made to adopt a particular situation or material to the teachings of the invention without departing from the essential scope thereof. Therefore, it is intended that the invention not be limited to the particular embodiment disclosed, but that the invention include all embodiments falling within the scope of the following claims.

The invention claimed is:

1. Interior aircraft LED light unit comprising:
    at least one printed circuit board, on which a plurality of LEDs are connected to a power source, each one of the plurality of LEDs having a predetermined distance to the power source, and each one of the plurality of LEDs being associated with a respective thermal transfer member having a predetermined size, for transferring heat away from the respective LED,
    wherein, for at least some of the plurality of LEDs, the predetermined size of the respective thermal transfer member varies with the predetermined distance of the LED to the power source, with the predetermined size of the thermal transfer members decreasing for an increase in the predetermined distance of the LED to the power source, and
    wherein an operating temperature of each of the plurality of LEDs is between 70% and 130% of an average operating temperature of the plurality of LEDs.

2. The interior aircraft LED light unit according to claim 1,
    wherein the plurality of LEDs comprises a first LED, being associated with a first thermal transfer member, and a second LED, being associated with a second thermal transfer member,
    wherein the first LED is located closer to the power source than the second LED, and
    wherein the predetermined size of the first thermal transfer member is larger than the predetermined size of the second thermal transfer member.

3. The interior aircraft LED light unit according to claim 1, wherein each of the thermal transfer members is a thermal pad, in particular a thermal pad made from copper.

4. The interior aircraft LED light unit according to claim 1, wherein each of the thermal transfer members has a thermal transfer surface, in particular a substantially rectangular plate-shaped thermal transfer surface, wherein a surface area of the thermal transfer member that is associated with the LED having the lowest predetermined distance to the power source lies within the range of 0.5 mm$^2$ and 40 mm$^2$ and wherein a surface area of the thermal transfer member that is associated with the LED having the largest predetermined distance to the power source lies within the range of 0.2 mm$^2$ and 25 mm$^2$.

5. The interior aircraft LED light unit according to claim 1, wherein a ratio of the size of the thermal transfer member that is associated with the LED having the lowest predetermined distance to the power source to the size of the thermal transfer member that is associated with the LED having the largest predetermined distance to the power source lies within the range of 1.2 to 3.

6. The interior aircraft LED light unit according claim 1, wherein the difference between the size of the thermal transfer member that is associated with the LED having the lowest predetermined distance to the power source and the size of the thermal transfer member that is associated with the LED having the largest predetermined distance to the power source lies within the range of 0.3 mm$^2$ and 20 mm$^2$.

7. The interior aircraft LED light unit according to claim 1, wherein each of the thermal transfer members comprises a respective section of the at least one printed circuit board and at least one aperture in the at least one printed circuit board, in particular at least one slot in the at least one printed circuit board, the at least one aperture defining the respective section of the at least one printed circuit board and at least partially limiting a thermal transfer out of the respective section of the at least one printed circuit board.

8. The interior aircraft LED light unit according to claim 7, wherein a size of the respective section of the at least one printed circuit board of the thermal transfer member that is associated with the LED having the lowest predetermined distance to the power source lies within the range of 0.5 mm$^2$ and 40 mm$^2$ and wherein a size of the respective section of the at least one printed circuit board of the thermal transfer member that is associated with the LED having the largest predetermined distance to the power source lies within the range of 0.2 mm$^2$ and 25 mm$^2$.

9. The interior aircraft LED light unit according to claim 7, wherein a ratio of the size of the respective section of the at least one printed circuit board of the thermal transfer member that is associated with the LED having the lowest predetermined distance to the power source to the size of the respective section of the at least one printed circuit board of the thermal transfer member that is associated with the LED having the largest predetermined distance to the power source lies within the range of 1.2 to 3.

10. The interior aircraft LED light unit according to claim 7, wherein a ratio of the size of the respective section of the at least one printed circuit board of the thermal transfer member that is associated with the LED having the lowest predetermined distance to the power source to the size of the respective section of the at least one printed circuit board of the thermal transfer member that is associated with the LED having the largest predetermined distance to the power source lies within the range of 1.5 to 2.

11. The interior aircraft LED light unit according to claim 1, wherein the thickness of the thermal transfer member lies within the range of 15 μm to 50 μm.

12. The interior aircraft LED light unit according to any claim 1, wherein the at least one printed circuit board comprises a base material which is made from fiber glass.

13. The interior aircraft LED light unit according to claim 1, wherein an operating temperature of each of the plurality of LEDs is between 80% and 120% of an average operating temperature of the plurality of LEDs.

14. The interior aircraft LED light unit according to claim 1, wherein the brightness and/or color of all of the plurality of LEDs is jointly adjustable.

15. An aircraft comprising at least one interior aircraft LED light unit according to claim 1, disposed inside the aircraft.

16. The interior aircraft LED light unit according to claim 1, wherein a ratio of the size of the thermal transfer member that is associated with the LED having the lowest predetermined distance to the power source to the size of the thermal transfer member that is associated with the LED having the largest predetermined distance to the power source lies within the range of 1.5 to 2.

17. The interior aircraft LED light unit according to claim 1, wherein the thickness of the thermal transfer member is about 30 μm.

18. A method of designing an interior aircraft LED light unit, comprising the steps of:

provinding at least one printed circuit board, on which a plurality of LEDs are connected to a power source, each one of the plurality of LEDs having a predetermined distance to the power source, determining a preliminary operating temperature of each one of the plurality of LEDs, when supplied with a predefined supply current from the power source, and providing, for each one of the plurality of LEDs a respective thermal transfer member having a predetermined size for transferring heat away from the respective LED, wherein the predetermined size of the respective thermal transfer member is selected dependent on the preliminary operating temperature of the respective LED, such that actual operating temperatures of the plurality of LEDs are leveled as compared to the preliminary operating temperatures, wherein the actual operating temperature of each of the plurality of LEDs is between 70% and 130% of an average operating temperature of the plurality of LEDs and wherein, for at least some of the plurality of LEDs, the predetermined size of the respective thermal transfer member varies with the predetermined distance of the LED to the power source, with the predetermined size of the thermal transfer members decreasing for an increase in the predetermined distance of the LED to the power source.

* * * * *